US006281112B1

United States Patent
Sugiyama

(10) Patent No.: US 6,281,112 B1
(45) Date of Patent: *Aug. 28, 2001

(54) STRUCTURE OF INTERLAYER INSULATOR FILM AND METHOD FOR PLANARIZATION OF INTERLAYER INSULATOR FILM

(75) Inventor: Satoru Sugiyama, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/844,658

(22) Filed: Apr. 21, 1997

(30) Foreign Application Priority Data

Apr. 19, 1996 (JP) .................................................. 8-097901

(51) Int. Cl.[7] ........................... H01L 21/90; H01L 21/283
(52) U.S. Cl. ........................................... 438/624; 438/435
(58) Field of Search ..................................... 257/632, 633, 257/634, 635, 637, 638; 438/424, 427, 435, 624, 626, 778, 780, 618, 622–23

(56) References Cited

U.S. PATENT DOCUMENTS

| 5,003,062 | 3/1991 | Yen . | |
|---|---|---|---|
| 5,250,472 | 10/1993 | Chen et al. . | |
| 5,306,947 | * 4/1994 | Adachi et al. | 257/635 |
| 5,366,850 | 11/1994 | Chen et al. . | |
| 5,716,872 | * 2/1998 | Isobe | 438/624 |
| 5,744,378 | * 4/1998 | Homma | 438/624 |
| 5,786,625 | * 7/1998 | Yamaha | 257/634 |

FOREIGN PATENT DOCUMENTS

| 0249173A1 | 12/1987 | (EP) . |
| 4-165651 | 6/1992 | (JP) . |
| 4-359544 | 12/1992 | (JP) . |
| 5-55391 | 3/1993 | (JP) . |
| 5-267283 | 10/1993 | (JP) . |

OTHER PUBLICATIONS

Patent Abstracts of Japan, E91, vol. 6, No. 12, p. 137, Jan. 23, 1982 corresponding to JP56–135928 (Fujitsu).
Wolf et al. "Silicon Processing for the VLSI Era" vol. 1, 1986, Lattice Press, pp. 532–533 and 546.*

* cited by examiner

Primary Examiner—Olik Chaudhuri
Assistant Examiner—Anh Duy Mai
(74) Attorney, Agent, or Firm—Sughrue, Mion, Zinn, Macpeak & Seas, PLLC

(57) ABSTRACT

An interlayer insulator film in a semiconductor device comprises a BPSG film formed to cover a circuit pattern formed on a semiconductor substrate, and a ladder structure SOG film having a ladder structure in a molecular structure, to cover the BPSG film. The ladder structure SOG /film is etched back by a dry etching to partially expose the BPSG film, /and an exposed portion of the BPSG film is selectively etched by a wet /etching of a buffered HF using the remaining SOG film as a mask, since a /selective etching ratio by the buffered HF between the ladder structure /SOG film and the BPSG film is large. Thus, a planarized interlayer /insulator film formed of the remaining BPSG film and the remaining /ladder structure SOG film is obtained.

10 Claims, 6 Drawing Sheets

LADDER STRUCTURE SOG n=10~13

CONVENTIONAL SOG n ≤ 11

STRUCTURE OF INTERLAYER INSULATOR FILM AND METHOD FOR PLANARIZATION OF INTERLAYER INSULATOR FILM

BACKGROUND OF THE INVENTION

1. Field of the Invention

The present invention relates to a semiconductor device, and more specifically to a structure of an interlayer insulator film in a semiconductor device, and a method for planarizing an interlayer insulator film in a semiconductor device.

2. Description of Related Art

With an elevated integration density of semiconductor devices, a three-dimensional structure of an integrated circuit is becoming complicated more and more, and on the other hand, a demand for the degree of flatness in an interlayer insulator film formed on a circuit pattern is becoming severe more and more because it is required for a lithography. In the prior art, the most conventional planarization method is a so-called reflow process in that an interlayer insulator film is formed of BPSG (borophosphosilicate glass, namely, silicon oxide added with impurities of phosphorus (P) and boron (B)), and a heat treatment is conducted at a temperature not less than a melting point so as to cause the interlayer insulator film to be planarized by action of fluidization caused by a surface tension. This is a very simple method.

Furthermore, although the planarization was realized by a single layer of BPSG, a so-called two-layer planarization process is recently used because of a further elevated degree of flatness required in the most advanced semiconductor devices. For example, after the reflow of the BPSG film, a SOG (spin on glass) film is deposited, and the whole surface is etched back by a dry etching, for the purpose of further elevating the degree of flatness.

Referring to FIG. 1A to 1C, there are shown diagrammatic sectional views of a semiconductor device for illustrating one example of the prior art two-layer planarization process.

As shown in FIG. 1A, a gate oxide film 2 and a circuit pattern 3, formed of for example a polysilicon film, are formed on a principal surface of a semiconductor substrate 1, and a BPSG having a phosphorus concentration of 3 mol % to 6 mol % and a boron concentration of 8 mol % to 15 mol % is deposited by means of a CVD (chemical vapor deposition) process, to form an interlayer film 4 having a desired thickness and covering the circuit pattern 3 and the gate oxide film 2, and then, a heat treatment is conducted at a temperature of 750° C. to 900° C. to cause the reflow of the deposited BPSG film 4.

Then, as shown in FIG. 1B, an SOG film 6 is formed to cover the BPSG film 4, by a spin coating and a succeeding baking at 300° C. to 400° C. Thereafter, as shown in FIG. 1C, a whole surface etchback is carried out by use of a dry etching. Thus, a planarization is completed.

In the process as mentioned above, because of viscous fluidization of the SOG film, the film thickness of the SOG film in an area excluding the circuit pattern becomes larger than the film thickness of the SOG film on the circuit pattern. As a result, the degree of flatness is further elevated as a matter of course, in comparison with the reflow of the single layer of BPSG film.

Furthermore, in the case of not capable of executing the heat treatment at a high temperature of not less than 750° C., as in the case that an interlayer insulator film is formed on the semiconductor substrate having a wiring conductor formed of a non-refractory metal such as aluminum, it is possible to utilize a process proposed by Japanese Patent Application Pre-examination Publication Nos. JP-A-4-165651 and JP-A-5-267283. In this process, an interlayer insulator film is formed by depositing a silicon oxide film by use of a plasma CVD process (PE(plasma enhanced)-SiO film), and similarly to the first mentioned two-layer planarization process, an SOG film is deposited by a spin coating and a succeeding baking at 300° C. to 400° C., and then, a whole surface etchback is carried out by use of a dry etching.

Alternatively, for the purpose of seeking an elevated flatness, a etchback process using a chemical mechanical polishing (CMP) becomes gradually widely used. This CMP process makes it possible to obtain an excellent flatness, depending upon an underlying layer shape at some degree.

In addition, Japanese Patent Application Pre-examination Publication Nos. JP-A-5-055391 proposes a process for forming an SOG film by means of a plurality of executions of the spin coating, in order to elevate the degree of flatness, and Japanese Patent Application Pre-examination Publication Nos. JP-A-4-359544 proposes a process in which a lithography is executed to the effect that, after an SOG film is deposited and baked, the SOG film is intentionally left on an interlayer insulator film in a recess portion, namely, in an area excluding a circuit pattern, for the purpose of elevating the degree of flatness.

However, the above mentioned various prior art planarization processes of the interlayer insulator film have the following disadvantages: First, a large three-dimensional step still remains even after the etchback process is executed, since a selective etching ratio between the SOG film and the underlying BPSG film or PE-SiO film is not sufficient. In brief, the selective etching ratio between the SOG film and the BPSG film or PE-SiO film is limited to 1.6 to 2.0. For example, assuming that there is a large three-dimensional step of 1 μm before formation of the interlayer insulator film, since only 10% to 30% of the step can planarized by the prior art planarization processes, the three-dimensional step of not less than 0.7 μm remains even after the formation of the interlayer insulator film.

In the most advanced DRAM (dynamic random access memory), a capacitor has recently become remarkably large in size because of a necessity of ensuring a capacitor plate area, and a satisfactory degree of flatness can be no longer obtained by the prior art planarization processes.

Secondly, the CMP process is satisfactory to compensate for the flatness property so as to obtain a desired degree of flatness, but a throughput is low and a running cost is high so that a production efficiency drops as a whole. In the CMP process, in addition, a substrate to be etched back is desired to be as flat as possible. Therefore, when the CMP process is applied to a semiconductor device having many concaves and convexes such as a DRAM, it is difficult to ensure a uniform etching rate, with the result that the advantage of the CMP process can be sufficiently enjoyed. In a semiconductor device such as DRAM which is low in an added value, it is important to inexpensively and quickly produce semiconductor device chips. In this aspect, the CMP process is not suitable in practice. In other words, the CMP process has many problems to be solved.

SUMMARY OF THE INVENTION

Accordingly, it is an object of the present invention to provide a structure of an interlayer insulator film in a semiconductor device, and a method for planarizing an interlayer insulator film in a semiconductor device, both of which have overcome the above mentioned defects of the conventional ones.

Another object of the present invention is to provide a structure of an interlayer insulator film in a semiconductor device, which is simpler in construction, more inexpensive, and more excellent in flatness than the prior art interlayer insulator films, and a method for forming the interlayer insulator film in accordance with the present invention.

The above and other objects of the present invention are achieved in accordance with the present invention by a semiconductor device comprising a circuit pattern formed on a semiconductor substrate and an interlayer insulator film formed to cover the circuit pattern, the interlayer insulator film being formed of a silicon oxide film formed to cover the circuit pattern, and a spin-on-glass film formed to cover the silicon oxide film and having a ladder structure in a molecular structure. Alternatively, the spin-on-glass film can be formed of an organic spin-on-glass film which has a chain combination that no longer assumes the ladder structure and which is obtained by structure-converting a spin-on-glass film having a ladder structure in a molecular structure, by use of a heating treatment.

In a preferred embodiment, the silicon oxide film is formed from a material selected from the group consisting of a borophosphosilicate glass film (BPSG film), a plasma CVD silicon oxide film (PE-SiO film) and a silicon oxide film formed using an organic source, such as tetraethoxysilane (TEOS).

Furthermore, according to another aspect of the present invention, there is provided a method for forming an interlayer insulator film in a semiconductor device, comprising the steps of forming a silicon oxide film to cover a circuit pattern formed on a semiconductor substrate, forming a spin-on-glass film having a ladder structure in a molecular structure, to cover the silicon oxide film, etching back the spin-on-glass film to partially expose the silicon oxide film, and selectively etching an exposed portion of the silicon oxide film using the remaining spin-on-glass film as a mask, so that a planarized interlayer insulator film formed of the remaining silicon oxide film and the remaining spin-on-glass film is obtained.

Specifically, the spin-on-glass film is deposited by a spin coating, and then, baked at a temperature of not higher than 750° C. for condensation cure. The selective etching is carried out by a wet etching using a buffered hydrofluoric acid.

The above and other objects, features and advantages of the present invention will be apparent from the following description of preferred embodiments of the invention with reference to the accompanying drawings.

DESCRIPTION OF THE PREFERRED EMBODIMENTS

Referring to FIG. 2A to 2E, there are shown diagrammatic sectional views of a semiconductor device for illustrating one embodiment of the process in accordance with the present invention for planarizing an interlayer insulator film.

Figure 1A:
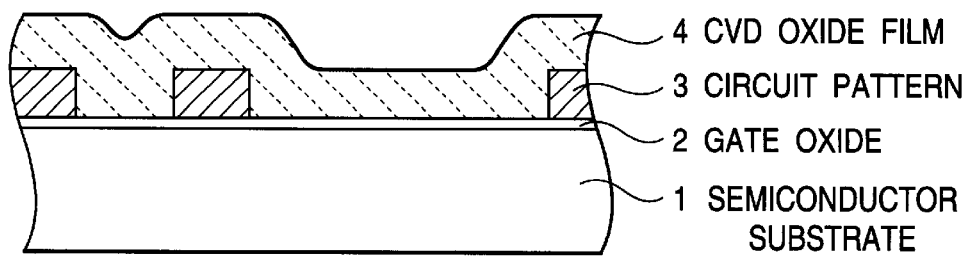
FIG. 1A to 1C are diagrammatic sectional views of a semiconductor device for illustrating one example of the prior art two-layer planarization process.
Figure 1B:
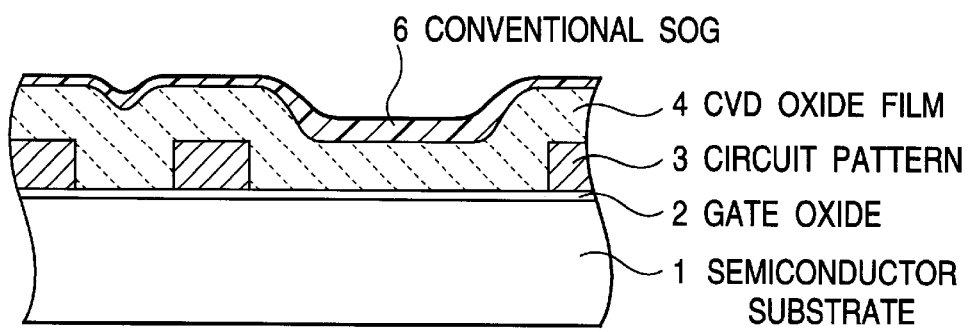
Figure 1C:
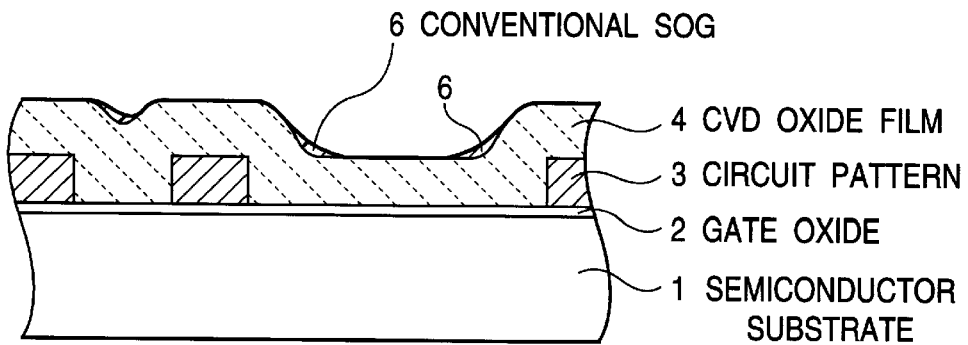
Figure 2A:
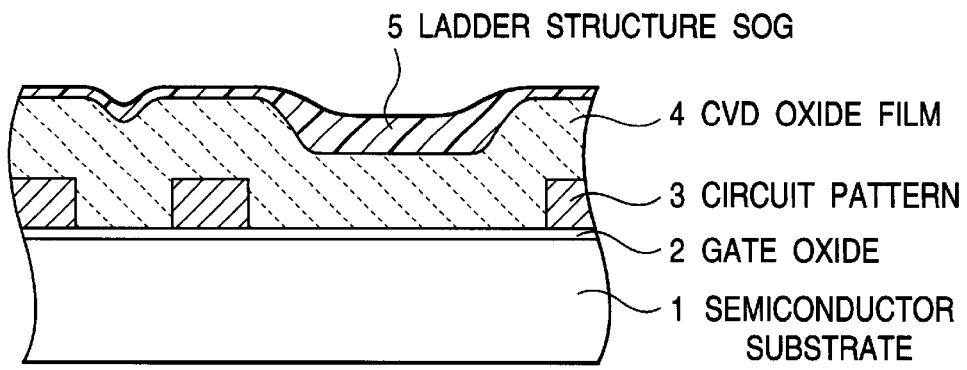
FIG. 2A to 2G are diagrammatic sectional views of a semiconductor device for illustrating one embodiment of the process in accordance with the present invention for planarizing an interlayer insulator film.

First, as shown in FIG. 2A, and similarly to the prior art process, after a gate oxide film 2 and a circuit pattern 3 formed of for example a polysilicon film are formed on a principal surface of a semiconductor substrate 1, a BPSG having a phosphorus concentration of 3 mol % to 6 mol % and a boron concentration of 8 mol % to 15 mol % is deposited by means of a suitable CVD process, to form an interlayer film 4 having a desired thickness and covering the circuit pattern 3 and the gate oxide film 2, and then, a heat treatment is conducted at a temperature of 750° C. to 900° C. to cause the reflow of the deposited BPSG film 4.

Furthermore, a ladder structure SOG film is deposited by a spin coating to cover the BPSG film 4, and succeedingly, a baking is conducted at a temperature of 300° C. to 400° C. so as to cause a condensation cure. Thus, the ladder structure SOG film 5 is formed as shown in FIG. 2A.

Figure 3A:
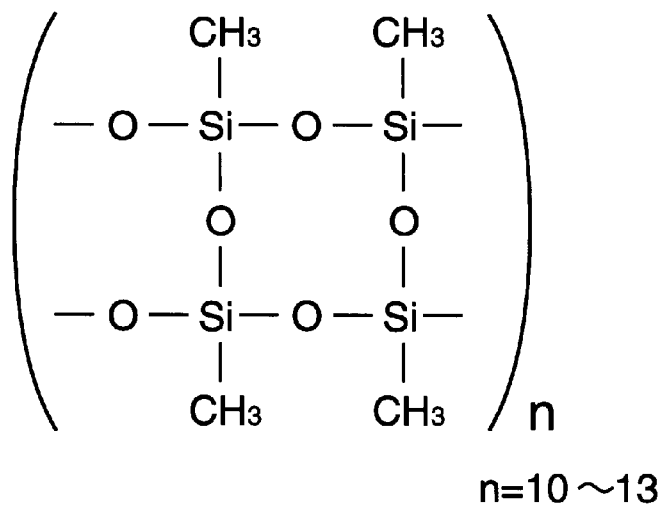
FIGS. 3A and 3B are chemical structure diagrams of the ladder structure SOG and the conventional SOG, respectively.
Figure 3B:
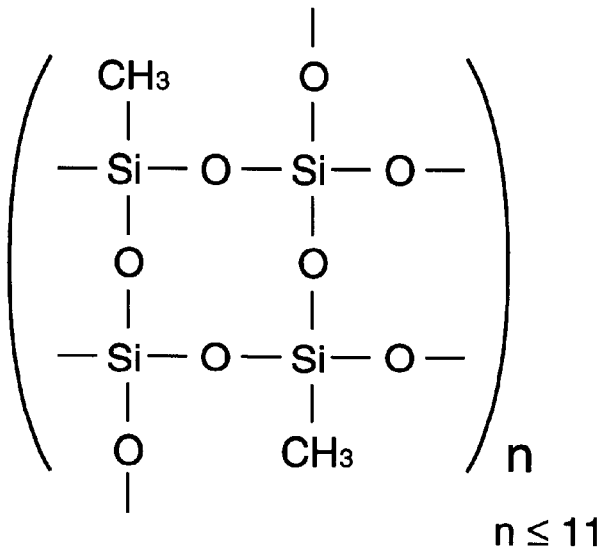

Here, the ladder structure SOG film has a chemical structure shown in FIG. 3A, which would be understood to be clearly different from a conventional SOG having a chemical structure as shown in FIG. 3B. Explaining on the basis of the examples shown in FIGS. 3A and 3B, the ladder structure SOG is constituted by repeating the structure shown in FIG. 3A only in a horizontal direction in FIG. 3A, and therefore, has a ladder structure extending only in one direction, but the conventional SOG is constituted by repeating the structure shown in FIG. 3B both in a horizontal direction and in a vertical direction in FIG. 3B, and therefore, have a two-dimensional spread. Therefore, it may be said that the ladder structure SOG film is an organic SOG film which is composed of silicon oxide and an organic component such as $CH_3$ and which has the ladder structure extending only in one direction. The ladder structure SOG having the chemical structure shown in FIG. 3A is commercially available under the tradename "GLASS RESIN SOG" from SHOWA DENKO K. K. in Japan.

Figure 4:
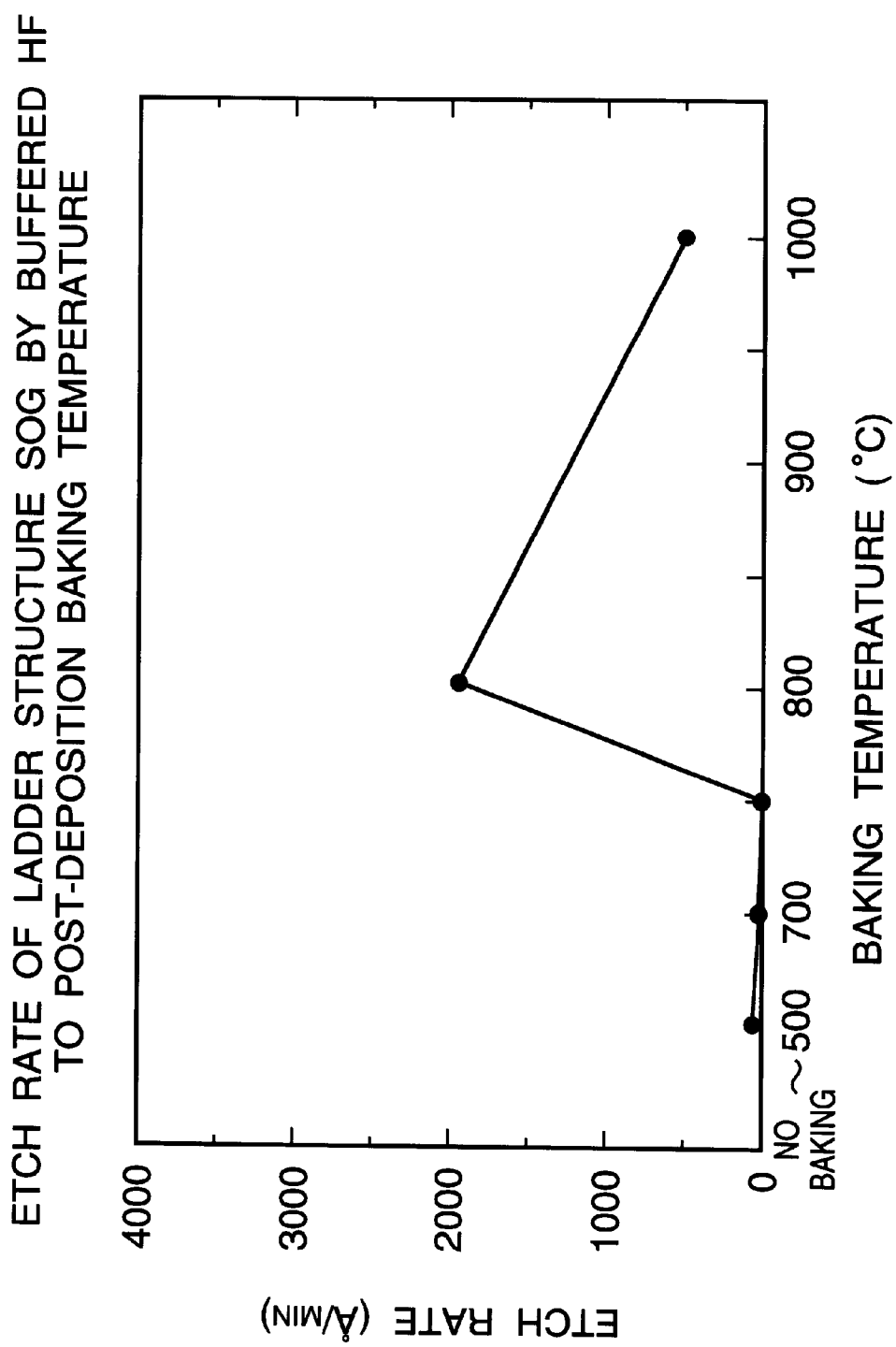
FIG. 4 is a graph showing an etch rate of the ladder structure SOG by a buffered HF to a post-deposition baking temperature.

Because of this difference in the chemical structure, the ladder structure SOG has a high etching resistivity to a buffered HF (hydrofluoric acid) (which is a mixed liquid composed of a hydrofluoric acid and an ammonium fluoride). Referring to FIG. 4, there is shown a graph showing an etch rate of the ladder structure SOG by a buffered HF to a post-deposition baking temperature. As seen from FIG. 4, the ladder structure SOG still maintains a high etching resistivity although it is baked at a temperature of 300° C. to 400° C. Comparing the ladder structure SOG with a thermal oxidized film in the same processing condition, the etch amount of the ladder structure SOG is about 5% or less of the etch amount of the thermal oxidized film, and the ladder structure SOG exhibits a high selective etching ratio to a wet etching of a buffered HF, in comparison with other silicon oxide films. This is considered because a bond strength of the ladder structure of the ladder structure SOG shows a high etching resistivity to the buffered HF. However, if a heat treatment is conducted at a temperature of less than 750° C., the ladder structure is destroyed and the chemical structure becomes an ordinary chain combination which no longer assumes the ladder structure as shown in FIG. 3A but still contains methyl ($CH_3$) at some degree, and the etch rate by the buffered HF abruptly elevates as shown in FIG. 4. This is a phenomenon which can be observed particularly in the ladder structure SOG, and which may therefore be said to be inherent to the ladder structure SOG.

Figure 2B:
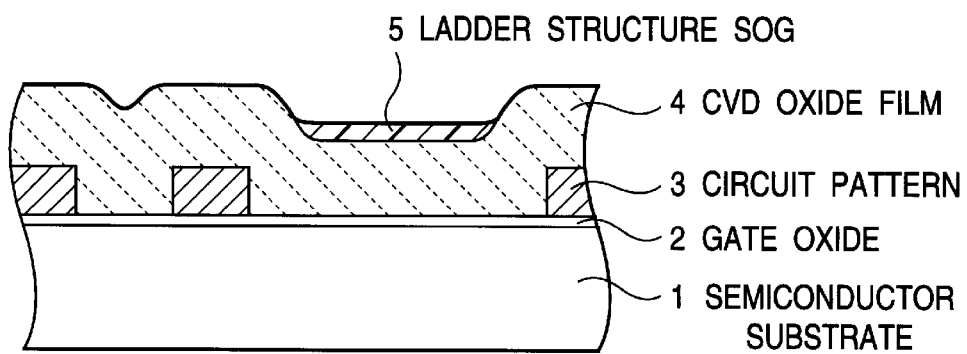

Thereafter, as shown in FIG. 2B, a whole surface etchback is carried out by use of a dry etching. Since the selective etching ratio between the ladder structure SOG film and the BPSG film is about 1.3, the whole surface etchback can be carried out without trouble. In accordance with concaves and convexes of the circuit pattern on the substrate, and because of viscous fluidization of the SOG film, the film thickness of the SOG film in an area excluding the circuit pattern (convex) becomes larger than the film thickness of the SOG film on the circuit pattern (convex), with the result that the BPSG film on the circuit pattern (convex) is first exposed in the process of the whole surface etchback. At this time, the whole surface etchback is stopped.

Figure 2C:
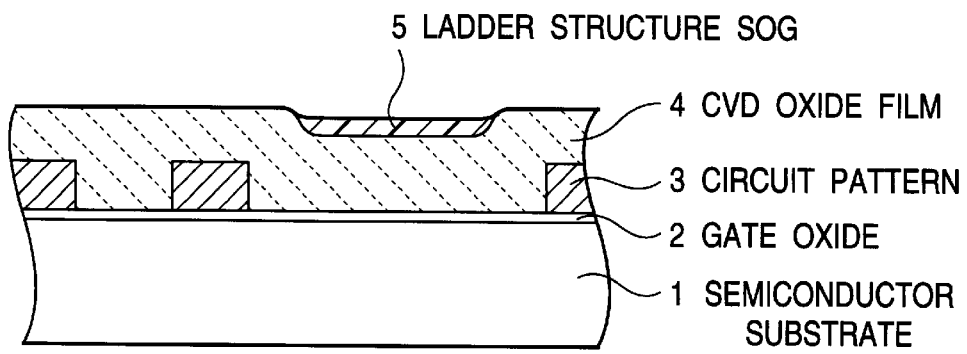

Then, a wet etching is conducted using the buffered HF for a suitable length of time. As mentioned above, since the ladder structure SOG exhibits the high etching resistivity to the buffered HF, the exposed portion of the BPSG film 4 is selectively etched, so that, as shown in FIG. 2C, an interlayer insulator film having a high degree of flatness from a three-dimensional viewpoint is formed. At this time, a planarization of the interlayer insulator formed of the BPSG film and the SOG film can be completed.

Figure 2D:
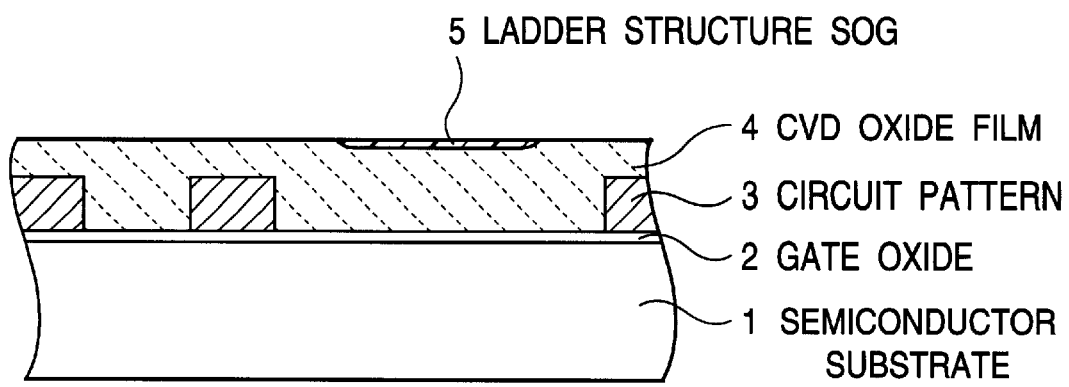
Figure 2E:
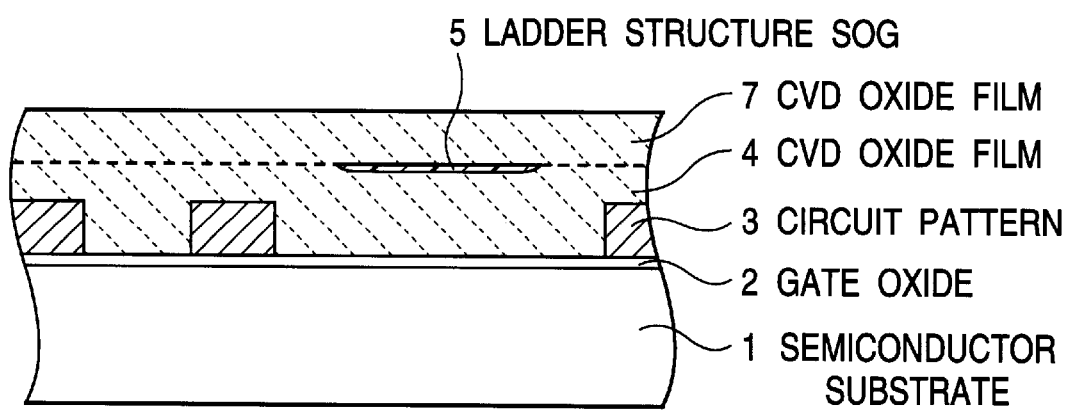

However, if necessary or preferable, the whole surface etchback is conducted again to further partially remove the remaining ladder structure SOG film 5 and the BPSG film 4 as shown in FIG. 2D, and then, another interlayer insulator film 7 is deposited on the remaining ladder structure SOG film 5 and the BPSG film 4, as shown in FIG. 2E, so that a further elevated degree of flatness can be obtained. Thus, a planarization of the interlayer insulator formed of the BPSG film and the SOG film is completed.

Figure 2F:
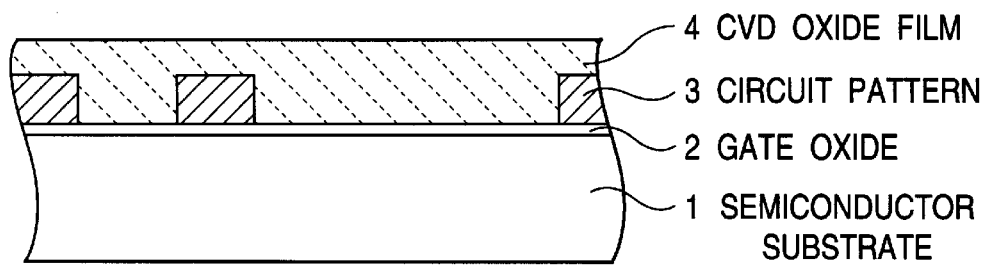
Figure 2G:
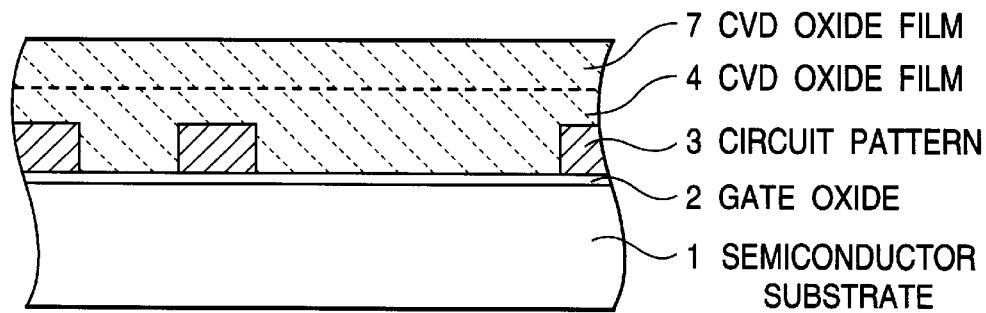

Alternatively, the whole surface etchback is conducted again to completely remove the remaining ladder structure SOG film 5 as shown in FIG. 2F, and then, another interlayer insulator film 7 is deposited on the BPSG film 4, as shown in FIG. 2G. Also in this case, the interlayer insulator formed of the BPSG film having a further elevated degree of flatness can be obtained.

In the above mentioned embodiment, the interlayer insulator formed of the BPSG film and the SOG film and the process for forming the same have been described. However, the present invention can be applied to the case unable to execute the heat treatment at a high temperature of not less than 750° C., as in the case that an interlayer insulator film is formed on the semiconductor substrate having a wiring conductor formed of a non-refractory metal such as aluminum. This will be called a second embodiment.

In this second embodiment, first, an interlayer insulator film is formed by depositing a silicon oxide film by use of a process, such as a plasma CVD process or a O3-TEOS (tetraethoxysilane)-CVD process, capable of growing a silicon oxide film at a low temperature, and then, a ladder structure SOG film is deposited by a spin coating to cover the silicon oxide film and to fill concaves formed between the wiring conductors, and succeedingly, a baking is conducted at a temperature of 300° C. to 400° C. so as to cause a condensation cure. Thereafter, similarly to the first embodiment as mentioned above, a whole surface etchback is carried out by use of a dry etching, and only an exposed silicon oxide film showing a pattern corresponding to the wiring conductor (namely, circuit pattern) is selectively etched by the buffered HF. Thus, a planarized interlayer insulator film can be obtained similarly to the first embodiment.

In the second embodiment, the underlying insulator film under the ladder structure SOG film 5 is formed of the PE-SiO film or the O3-TEOS-CVD-NSG(non-doped silicate glass) film which are formed by a low temperature process. If a thermal history in a semiconductor device will become a problem in future, the present invention can be applied to semiconductor devices having aluminum wirings in a circuit pattern, by using the interlayer insulator film of the second embodiment in place of the BPSG film which needs the heat treatment at a high temperature. This second embodiment is also effective in preventing enlargement of shallow diffused layers.

In the second embodiment, furthermore, when the SOG film is etched, since the underlying silicon oxide film 4 is selectively etched together, the degree of flatness of an upper surface does not depend upon the shape of the underlying silicon oxide film 4. Accordingly, the second embodiment has generality more excellent than that of the first embodiment.

In the first and second embodiments, in order to ensure a sufficient difference in the etch rate by the buffered HF between the interlayer insulator film and the SOG film, and in order to make the processing time as short as possible and to simplify the processing, the interlayer insulator film is formed of the BPSG film or the PE-SiO film. However, considering a coating property of the SOG, the interlayer insulator film is most preferred to be formed by using an organic source, such as TEOS (tetraethoxysilane), which can form an oxide film having an excellent step coverage. From a different viewpoint, it can be said that the interlayer insulator film may be formed of any material, if it has some degree of etch rate to the buffered HF and can ensure a substantial degree of selective etching ratio between the interlayer insulator film material and the ladder structure SOG film.

As seen from the above, the interlayer insulator film structure in accordance with the present invention is characterized in that, since it is constituted of a stacked structure composed of a base layer of a silicon oxide film such as a BPSG film and a PE-SiO film and an overlying ladder structure SOG film, the ladder structure SOG film can be utilized as a mask for selectively etching the silicon oxide film in a manufacturing process. Thus, a convex of the silicon oxide film can be selectively etched and removed, so that a planarized interlayer insulator film can be obtained.

Furthermore, in the method in accordance with the present invention for forming the interlayer insulator film, the ladder structure SOG film is deposited on the silicon oxide film, and then, is etched back to remove only the SOG film on the convex of the silicon oxide film, and furthermore, only the convex of the silicon oxide film is selectively etched using the remaining ladder structure SOG film as a mask. Thus, the excellently planarized interlayer insulator film can be formed inexpensively and simply.

The invention has thus been shown and described with reference to the specific embodiments. However, it should be noted that the present invention is in no way limited to the details of the illustrated structures but changes and modifications may be made within the scope of the appended claims.

What is claimed is:

1. A method for forming an interlayer insulator film in a semiconductor device, comprising the steps of:

forming a silicon oxide film to cover a circuit pattern formed on a semiconductor substrate;

forming a spin-on-glass film having a ladder structure in a molecular structure to cover said silicon oxide film;

etching back said spin-on-glass film to partially expose said silicon oxide film; and selectively etching an exposed portion of said silicon oxide film by a wet etching using the remaining spin-on-glass film as a mask, so that a planarized interlayer insulator film formed of the remaining silicon oxide film and said remaining spin-on-glass film is obtained.

2. A method as claimed in claim 1 wherein said spin-on-glass film is deposited by a spin coating and then baked at a temperature of not higher than 750° C. for condensation cure.

3. A method claimed in claim 2 wherein said selective etching is carried out by a wet etching using a buffered hydrofluoric cure.

4. A method claimed in claim 2 wherein said silicon oxide film is formed of a borophosphosilicate glass film (BPSG film).

5. A method claimed in claim 2 wherein said silicon oxide film is formed by means of a plasma CVD process.

6. A method claimed in claim 2 wherein said silicon oxide film is formed by using an organic source.

7. A method claimed in claim 6 wherein said organic source is tetraethoxysilane (TEOS).

8. A method as claimed in claim 1 wherein after the step of selectively etching the exposed portion of said silicon oxide film using the remaining spin-on-glass film as the mask, a second etching back is conducted to further remove said spin-on-glass film and the remaining silicon oxide film, and a second silicon oxide film is deposited on the whole surface so that a planarized interlayer insulator film including the remaining silicon oxide film and said second silicon oxide film deposited thereon, is obtained.

9. A method claimed in claim 8 wherein said second etching back is conducted to partially remove said spin-on-glass film, and then, said second silicon oxide film is deposited on the whole surface so that a planarized interlayer insulator film including the remaining silicon oxide film and spin-on-glass film and said second silicon oxide film deposited thereon, is obtained.

10. A method claimed in claim 8 wherein said second etching back is conducted to completely remove said spin-on-glass film, and then, said second silicon oxide film is deposited on the whole surface so that a planarized interlayer insulator film including only the remaining silicon oxide film and said second silicon oxide film deposited thereon, is obtained.

* * * * *